(12) United States Patent
Lozhkin et al.

(10) Patent No.: US 7,574,189 B2
(45) Date of Patent: Aug. 11, 2009

(54) TRANSMITTER AND POWER AMPLIFYING METHOD

(75) Inventors: Alexander N. Lozhkin, Kawasaki (JP); Takeshi Takano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 420 days.

(21) Appl. No.: 11/476,695

(22) Filed: Jun. 29, 2006

(65) Prior Publication Data

US 2007/0232246 A1 Oct. 4, 2007

(30) Foreign Application Priority Data

Mar. 30, 2006 (JP) .............................. 2006-094232

(51) Int. Cl.
*H04B 1/10* (2006.01)

(52) U.S. Cl. ...................... 455/308; 455/210

(58) Field of Classification Search ................ 455/308, 455/210, 108, 309–312, 116, 214, 337; 375/222–226, 375/340, 358

See application file for complete search history.

(56) References Cited

U.S. PATENT DOCUMENTS

| | | | | |
|---|---|---|---|---|
| 5,533,048 | A * | 7/1996 | Dolan ........................ | 375/222 |
| 5,751,705 | A * | 5/1998 | Sato .......................... | 370/335 |
| 5,825,807 | A * | 10/1998 | Kumar ....................... | 375/130 |
| 6,292,054 | B1 | 9/2001 | Ma et al. .................... | 330/126 |
| 6,631,254 | B1 * | 10/2003 | Wilson et al. ................ | 455/91 |
| 6,667,966 | B2 * | 12/2003 | Mitsume et al. ............. | 370/350 |
| 7,171,170 | B2 * | 1/2007 | Groe et al. .................. | 455/108 |
| 2003/0092405 | A1 | 5/2003 | Groe et al. | |
| 2005/0070233 | A1 * | 3/2005 | Sowlati ...................... | 455/126 |
| 2006/0189283 | A1 * | 8/2006 | Tanaka et al. ............. | 455/127.1 |
| 2008/0031382 | A1 * | 2/2008 | Aoki .......................... | 375/300 |

FOREIGN PATENT DOCUMENTS

| | | |
|---|---|---|
| JP | 2001-189630 A | 10/2001 |
| JP | 2002-368716 | 12/2002 |

(Continued)

OTHER PUBLICATIONS

A Multicarrier Primer by John M. Cioffi; Amati Communications Corporation and Standford University pp. 1-18.

(Continued)

*Primary Examiner*—Pablo N Tran
(74) *Attorney, Agent, or Firm*—Hanify & King, P.C.

(57) ABSTRACT

A transmitter includes a first limiter for performing a first clipping in which an amplitude part at a level higher than an amplitude level based on a first clipping level is cut out from an input signal to be subjected to power amplification, a second limiter for performing a second clipping in which an amplitude part at a level lower than the amplitude level based on a second clipping level is cut out from a first signal that has undergone the first clipping, a separation section for separating a second signal that has undergone the second clipping into an amplitude modulated part and a constant amplitude part, a first amplifier for amplifying the amplitude modulated part, a second amplifier for amplifying the constant amplitude part, and a combiner for outputting a third signal obtained by combining the amplitude part amplified by the first amplifier and the constant amplitude part amplified by the second amplifier.

12 Claims, 6 Drawing Sheets

FOREIGN PATENT DOCUMENTS

WO     WO 03/077494 A     9/2003

OTHER PUBLICATIONS

New OFDM Peak-to-Average Power Reduction Scheme by Jean Armstrong; Dept. of Electronic Engineering; La Trobe University, Bundoora, Victoria 3086 Australia pp. 5.

A. Saul: Analysis of Peak Reduction in OFDM Systems based on Recursive Clipping, in Proc. Of Int. OFDM-Workshop, vol. 1, Hamburg, Germany, Sep. 24-25, 2003; pp. 6.

Design Space Exploration for Clipping and Filtering PAPR Reduction Techniques in OFDM Systems by L.D. Kabulepa et al. Darmstadt University of Technology, Institute of Microelectronic Systems Karlstr. 15, 64283 Darmstadt Germany; pp. 5.

Communication from EPO with extended European Search Report dated Jul. 10, 2007.

* cited by examiner

TRANSMITTER AND POWER AMPLIFYING METHOD

BACKGROUND OF THE INVENTION

1. Field of the Invention

The present invention relates to a transmitter used for a communication system having a high peak-to-average power ratio (PAPR), and more particularly, to an amplifier and an amplifying method. Known examples of a system having a high PAPR include an OFDM (orthogonal frequency division multiplexing) communication system.

2. Description of the Related Art

FIG. 1 shows a typical OFDM transmitter. As shown in FIG. 1, the OFDM transmitter includes: a serial-to-parallel converter (S/P) 1 for performing serial-to-parallel conversion on an input bit stream (source of data to be transmitted); an inverse fast Fourier processor (IFFT) 2 having a size of M; a parallel-to-serial converter (P/S) 3; an oversampling block (interpolator) (OS) 4; a digital-to-analog converter (DAC) 5; an output low-pass filter (LPF) 6; an RF up converter (RF) 7; and a high-power amplifier (HPA) 8 that operates in class A or class A-B.

The OFDM transmitter shown in FIG. 1 generates an OFDM signal having a high PAPR level. In order to amplify the high-PAPR OFDM signal, it is necessary to employ a high input back-off level linear amplifier that operates in class A or class A-B. However, the amplifier of this type is low in power efficiency.

The simplest approach to reducing a PAPR of the OFDM signal is to clip (cut out) high amplitude peaks thereof. A variety of clipping techniques have been proposed. In some of the techniques, outputs of an inverse fast Fourier transform (IFFT) are clipped before interpolation (oversampling (OS)). However, the signal must be interpolated before digital-to-analogue conversion, which may cause peak re-growth. To avoid the problem of peak re-growth, the signal may be clipped after interpolation. However, such the scheme causes extremely significant out-of-band power.

A single clipping method may be employed as one of approaches for reducing the out-of-band power to a predetermined level. FIG. 2 shows a configuration example of an OFDM transmitter to which a PAPR reducing scheme using the single clipping method is applied.

The OFDM transmitter shown in FIG. 2 is provided with: an IFFT 9 in place of the IFFT 2 shown in FIG. 1; a limiter 10 to which an output (OFDM signal) from the P/S 3 is inputted; and an LPF 11 to which an output from a limiter 10 is inputted, the LPF 11 being connected to the DAC 5.

The input vector is first converted from a frequency domain to a time domain by using an oversize IFFT 9. In a case where an oversampling factor of the IFFT 9 is K, the input vector is extended by adding M*(K−1) zeros in the middle of the vector. As a result, trigonometric interpolation is performed in the time domain. The oversampled or interpolated signal is then clipped by the limiter 10. In the limiter 10, hard-limiting is applied to the amplitude of the complex values x at the IFFT output.

[Expression 1]

$$\text{INPUT: } x = \rho \cdot \exp(j \cdot \phi)$$
$$\text{OUTPUT: } y(x) = \begin{cases} x & \text{for } \rho < A \\ A \cdot \exp(j \cdot \phi) & \text{for } \rho > A \end{cases} \quad \text{EXPRESSION (1)}$$

In Expression (1), A is a clipping level (CR). Note that both x and y are complex values. The clipping ratio CR is defined as a ratio of the clipping level A to the clipping level to a mean power of an unclipped baseband signal. After the clipping, frequency domain filtering is performed by the LPF 11, thereby performing waveform shaping and reducing the out-of-band power.

FIG. 3 shows a cumulative distribution function (CCDF) for clipping scheme shown in FIG. 2 in terms of different clipping levels (CR). In simulations shown in FIG. 3, a modulation scheme is QPSK (quadrature phase shift keying), where M=64 and K=2. A plot that corresponds to an OFDM transmission scheme (OFDM transmitter) shown in FIG. 1 is indicated as "OFDM" in FIG. 3. The filtering performed by the LPF 11 exhibits some peak re-growth (see FIG. 3). More compact CCDF is preferable in order to decrease a dynamic range of the HPA 8 and increase power efficiency of the HPA 8.

In addition to the OFDM transmitters shown in FIGS. 1 and 2, prior art with respect to the present invention includes techniques described in the following related art documents.

[Patent document 1] JP 2001-189630 B
[Patent document 2] JP 2002-368716 B

SUMMARY OF THE INVENTION

The present invention has an object to provide a technique capable of reducing a PAPR in a communication system employing a modulation process exhibiting a high PAPR.

Further, the present invention has an object to provide a technique capable of improving a power efficiency of an amplifier in a communication system employing a modulation process exhibiting a high PAPR.

The present invention adopts the following means in order to achieve the objects.

To be specific, according to the present invention, there is provided a transmitter, including:

a first limiter for performing a first clipping in which an amplitude part at a level higher than an amplitude level based on a first clipping level is cut out from an input signal to be subjected to power amplification;

a second limiter for performing a second clipping in which an amplitude part at a level lower than the amplitude level based on a second clipping level is cut out from a first signal that has undergone the first clipping;

a separation section for separating a second signal that has undergone the second clipping into an amplitude modulated part and a constant amplitude part;

a first amplifier for amplifying the amplitude modulated part;

a second amplifier for amplifying the constant amplitude part; and a combiner for outputting a third signal obtained by combining the amplitude part amplified by the first amplifier and the constant amplitude part amplified by the second amplifier.

According to the present invention, in the first clipping and the second clipping, a high peak part and a low peak are cut out from the input signal to be subjected to power amplification. Accordingly, compared to the single clipping method, it is possible to reduce the PAPR, increase the signal power, and suppress occurrence of nonlinear distortion. Further, the present invention is configured such that the signal to be subjected to power amplification is separated into the amplitude modulated part (AM part) and the constant amplitude part (DC part) to be amplified separately, thereby allowing efficient amplification of a high PAPR signal.

With the transmitter according to the present invention, it is preferable that a minimum amplitude level of the first signal be determined based on the second clipping level.

Further, with the transmitter according to the present invention, it is preferable that the constant amplitude part be removed from the second signal.

Further, with the transmitter according to the present invention, it is preferable that the second amplifier have more satisfactory power efficiency than the first amplifier. Accordingly, it is possible to improve the power efficiency relating to amplification with respect to the entire signal to be subjected to the power amplification.

Further, according to the present invention, there is provided a power amplifying method, including:

performing a first clipping in which an amplitude part at a level higher than an amplitude level based on a first clipping level is cut out from an input signal to be subjected to power amplification;

performing a second clipping in which an amplitude part at a level lower than the amplitude level based on a second clipping level is cut out from a first signal that has undergone the first clipping;

separating a second signal that has undergone the second clipping into an amplitude modulated part and a constant amplitude part; amplifying the amplitude modulated part by a first amplifier; amplifying the constant amplitude part by a second amplifier; and outputting a third signal obtained by combining the amplitude part amplified by the first amplifier and the constant amplitude part amplified by the second amplifier.

According to the present invention, it is possible to reduce a PAPR in a communication system (for example, an OFDM-based communication system) employing a modulation process exhibiting a high PAPR.

Further, according to the present invention, it is possible to improve a power efficiency of an amplifier in a communication system (for example, an OFDM-based communication system) employing a modulation process exhibiting a high PAPR.

DETAILED DESCRIPTION OF THE PREFERRED EMBODIMENT

Hereinafter, description will be made of the present invention with reference to the drawings. Components of an embodiment are mere examples, and the present invention is not limited to the embodiment.

[Outline of the Invention]

One of the main disadvantages of OFDM is its high PAPR. Therefore, OFDM transmitters require output amplifiers having high linearity and a wide dynamic range. Those amplifiers are expensive and inefficient. Nonlinearity of the amplifiers causes intermodulation products, resulting in unwanted out-of-band power.

Although the OFDM involves an extremely large PAPR, high magnitude peaks occur relatively rarely, and most of the transmitted power is concentrated in signals of low amplitude. Therefore, there is a possibility that a high PAPR OFDM signal is split into the two main parts, that is, a constant amplitude part and an amplitude modulated part, and the two parts are separately amplified later. Such signal separation allows implementation of an amplifier that is very well matched with a signal amplitude level, thereby making it possible to provide high amplification power efficiency.

The present invention allows an improvement in PAPR and HPA efficiency performances for the OFDM-based communication system. The improvement can be achieved through the following means.

(1) The OFDM signal is separated into two main parts, that is, an amplitude modulated (AM) part and a constant amplitude part (DC).

(2) An AM signal (AM component) and a DC signal (DC component) are separately amplified. At this time, it is possible to employ, for the DC component (constant amplitude signal), an HPA that, for example, operates in class C and has high power efficiency, and also possible to employ, for the AM component (amplitude modified signal), an HPA that, for example, operates in class A or class A-B and is higher in linearity but lower in power efficiency than class C.

(3) In addition, a PAPR level of the amplitude modulated part (AM signal) is reduced itself (by removal of the DC component), thereby improving the power efficiency of the HPA that operates linearly.

[Configuration Example of an OFDM Communication System]

Figure 4:
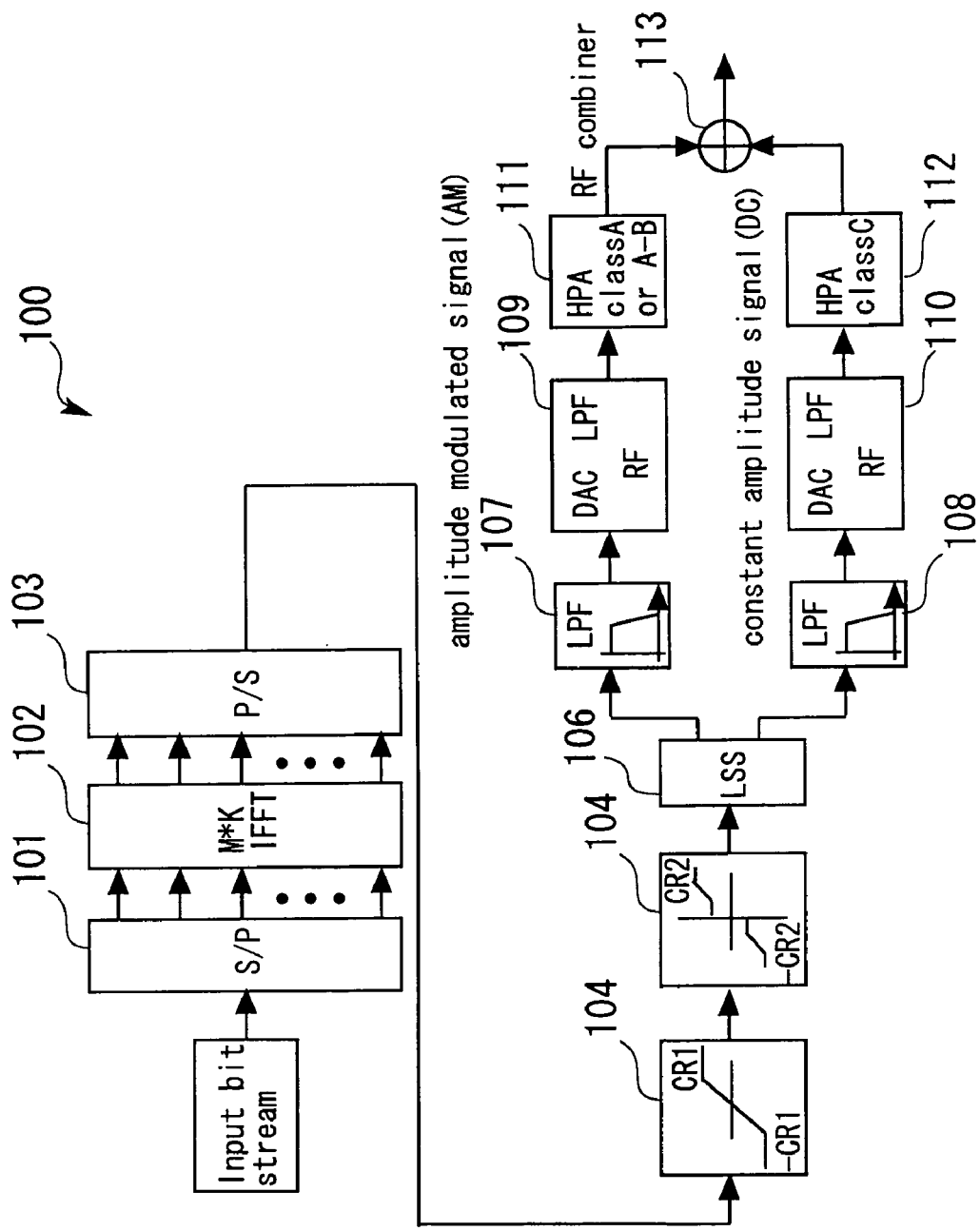
FIG. 4 shows a configuration example of an OFDM transmitter according to an embodiment of the present invention, illustrating double level clipping (CR1 and CR2) and filtering with following signal level shifting and splitting for PAPR reduction, which are implemented by the OFDM transmitter.

FIG. 4 shows a configuration example of an OFDM transmitter applied to the OFDM communication system according to the embodiment of the present invention.

Referring to FIG. 4, an OFDM transmitter 100 includes: a serial-to-parallel converter (S/P) 101 to which a source of data (input bit stream) is inputted; an inverse fast Fourier processor (IFFT) 102 (including an oversampling block (interpolator section) based on a zero-padding IFFT or an LPF interpolator circuit); a parallel-to-serial converter (P/S) 103; a first limiter 104 having a clipping level CR=CR1; a second limiter 105 having a clipping level CR2; a level shifter and splitter unit (LSS) 106 serving as a separation section; two LPFs 107 and 108; two digital-to-analog converters (DACs) 109 and 110 (including an LPF and an RF up converter); two high power amplifiers (HPAs) (one operates linearly while the other operates nonlinearly (or linearly)) 111 and 112; and an RF combiner 113.

The first limiter 104 having a clipping level A (CR1) operates according to Expression (1) described above. To be specific, the first limiter 104 clips (cuts) an amplitude part at a level higher than the clipping level CR1 from an OFDM signal outputted from the P/S 103 (that is, OFDM signal that has undergone S/P conversion, inverse Fourier transform, interpolation processing, and P/S conversion), and inputs the remaining part (OFDM signal: first signal) to the second limiter 105.

The second limiter 105 having the second clipping level A (CR2) operates according to Expression (2) described below. In Expression (2), CR2 represents the second clipping level.

[Expression 2]

$$\text{INPUT: } x = \rho \cdot \exp(j \cdot \phi)$$
$$\text{OUTPUT: } y(x) = \begin{cases} x & \text{for } \rho > CR2 \\ A \cdot \exp(j \cdot \phi) & \text{for } \rho < CR2 \end{cases}$$

EXPRESSION (2)

According to Expression (2) described above, the second limiter 105 obtains a minimum OFDM-signal amplitude level. In other words, the second limiter 105 clips an amplitude part at a level lower than the second clipping level CR2, and inputs the remaining part (OFDM signal: second signal) to the LSS 106. Thus, without using the second limiter 105, the minimum OFDM-signal amplitude level is zero (see FIGS. 7 and 8). In contrast, after introducing the second limiter 105, the minimum OFDM-signal amplitude level becomes CR2 (see FIG. 9).

The LSS 106 separates an OFDM signal inputted from the second limiter 105 into an amplitude part (AM signal) and a constant amplitude part (DC signal), and inputs the AM signal to the LPF 107 and the DC signal to the LPF 108.

Figure 3:
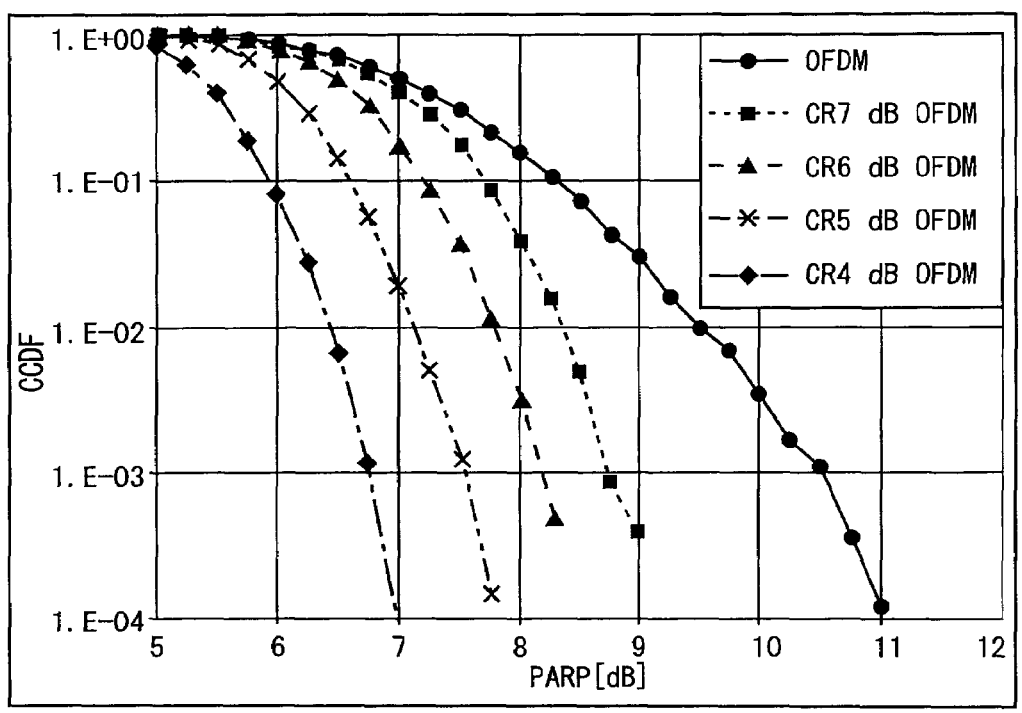
FIG. 3 shows a CCDF function of the OFDM transmitter shown in FIG. 2.

The LPFs 107 and 108 both have a function similar to a function of the LPF 11 shown in FIG. 3. To be specific, the LPFs 107 and 108 removes out-of-band components from within the clipping signals (AM signal and DC signal) performs waveform shaping. The LPF 107 inputs the AM signal to the DAC 109 and the DC signal to the DAC 110. Note that the LPF 108 may be omitted.

Figure 1:
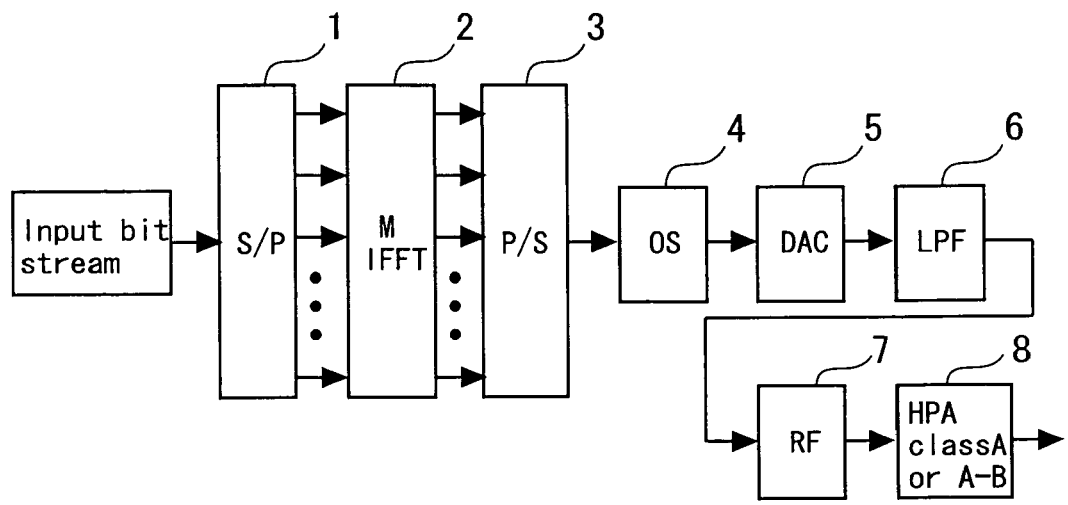
FIG. 1 shows a standard OFDM transmitter.
Figure 2:
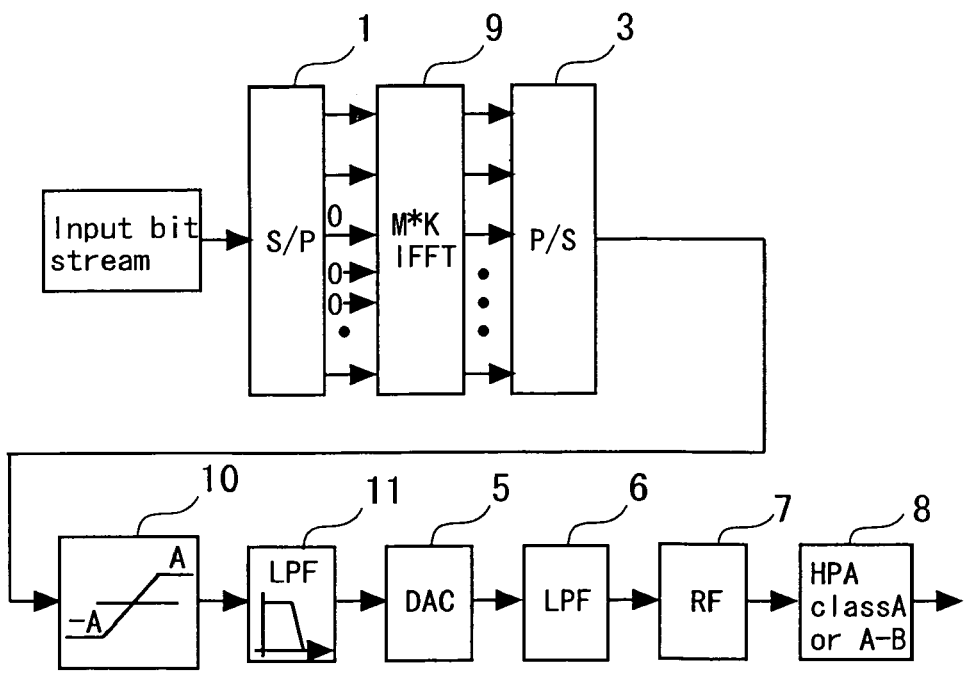
FIG. 2 shows a configuration example of an OFDM transmitter for implementing clipping and filtering (a single clipping method) to reduce a PAPR.

DAC 109 and DAC 110 both have a function similar to functions of the DAC 5, LPF 6, and RF 7 shown in FIG. 2, and performs processing including digital-to-analog conversion of the AM signal (DC signal), waveform shaping, and frequency conversion to an RF. An output from the DAC 109 is inputted to the HPA 111 serving as a first amplifier, while an output from the DAC 110 is inputted to the HPA 112 serving as a second amplifier. The AM signal and the DC signal are amplified in the HPAs 111 and 112, respectively, and combined by the RF combiner 113 serving as a combiner, thereby being outputted as an undistorted OFDM signal (third signal). Outputs from the HPAs 111 and 112 may be combined by the RF combiner 113 after having the amplitudes and phases corrected as necessary.

Figure 5:
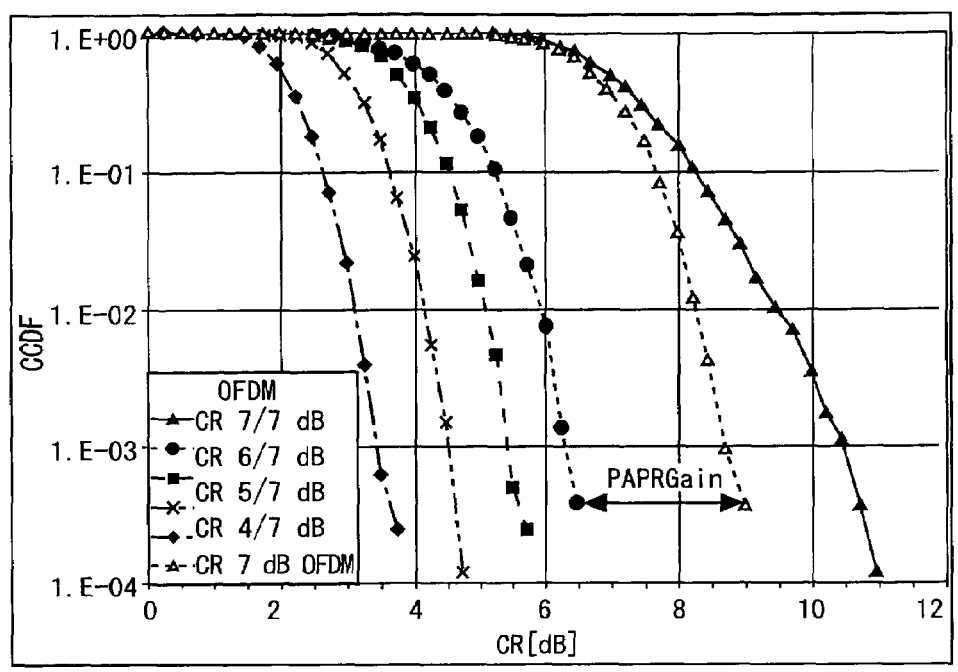
FIG. 5 shows a CCDF function of the OFDM transmitter shown in FIG. 4.

FIG. 5 shows a CCDF for the OFDM transmitter (PAPR reduction method according to the present invention) shown in FIG. 4. FIG. 5 shows simulation results obtained under the same simulation conditions as those for the plots of FIG. 3. In the legend of FIG. 5, the CR ratio is denoted as −CR2/CR1, where CR1=7 [dB]. Points marked as "CR 7 dB OFDM" correspond to the single clipping method (method using the configuration of FIG. 2) described above.

As shown in FIG. 5, employment of the second limiter 105 having the clipping level CR2 leads to a more compact CCDF characteristic. Thus, in FIG. 5, for example, a 2.5 [dB] of PAPR gain is obtained at level $10^{-4}$ with respect to the single clipping method. This means that a difference in OFDM symbol peak power that is exceeded by only 1/10,000 symbols is 2.5 [dB]. In other words, if the OFDM transmitter produces nonlinear distortions above 9 [dB], the method (configuration shown in FIG. 4) according to the present invention is used to raise the signal power by 2.5 [dB] and restrict a probability of nonlinear distortion to the same range as the case of the single clipping method.

In the simulations shown in FIG. 5, the first clipping level (CR1, Expression (1)) was fixed to 7 [dB] with respect to an OFDM signal average power, while the second clipping level (CR2, Expression (2)) is changed from −7 [dB] to −4 [dB] with respect to the OFDM signal average power.

Figure 6:
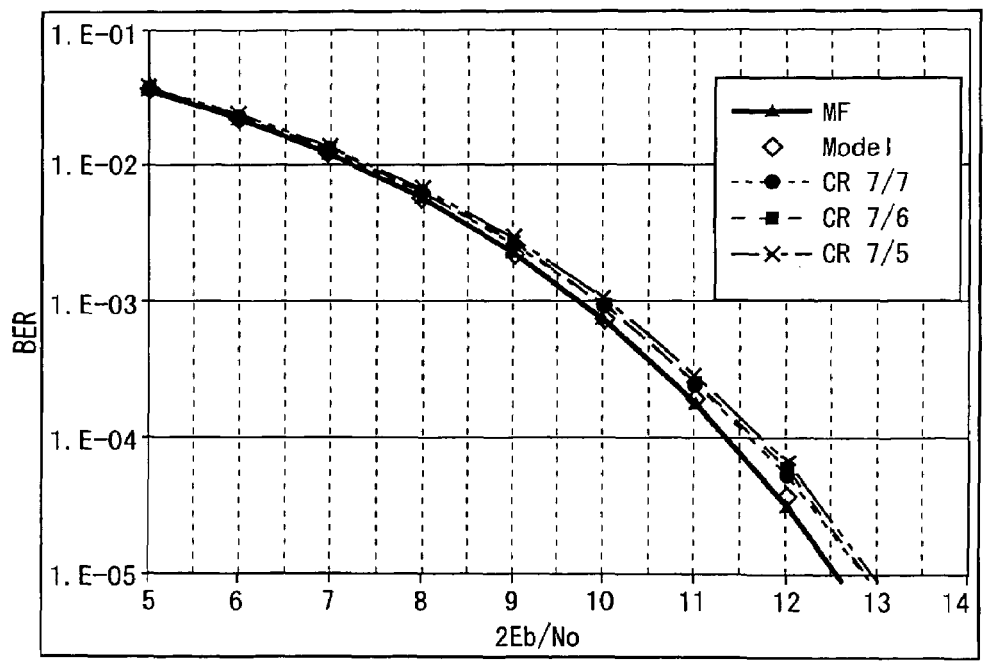
FIG. 6 shows BER degradation due to clipping noise.

With the technique according to the present invention, an entire constellation size is reduced and a noise component is added to the signal. However, the reduction in constellation size is corrected by normalization of a total signal power, which does not increase a BER (bit error rate). Second, the remaining clipping noise is added not at a receiver but at a transmitter. Therefore, in a fading channel, the clipping noise fades along with the signal, so influence of the clipping noise is by far smaller than that of a noise added at the receiver, which is not subject to the fading. FIG. 6 shows a BER in an additive Gaussian noise (AWGN) channel for this case.

FIG. 6 also shows a theoretical BER for undistorted OFDM (bold line, MF=matched filter). For QPSK modulation, the clipping noise causes negligible (under 0.25 [dB]) degradation in BER.

SPECIFIC EXAMPLE

Next, description will be made of a specific example of an OFDM signal processing performed by the OFDM transmitter 100 having the configuration shown in FIG. 4. The M OFDM samples of every OFDM block are independent identically-distributed Gaussian random variables. Such statistical independence is responsible for high variability of the OFDM signal, making its PAPR extremely high.

Figure 7:
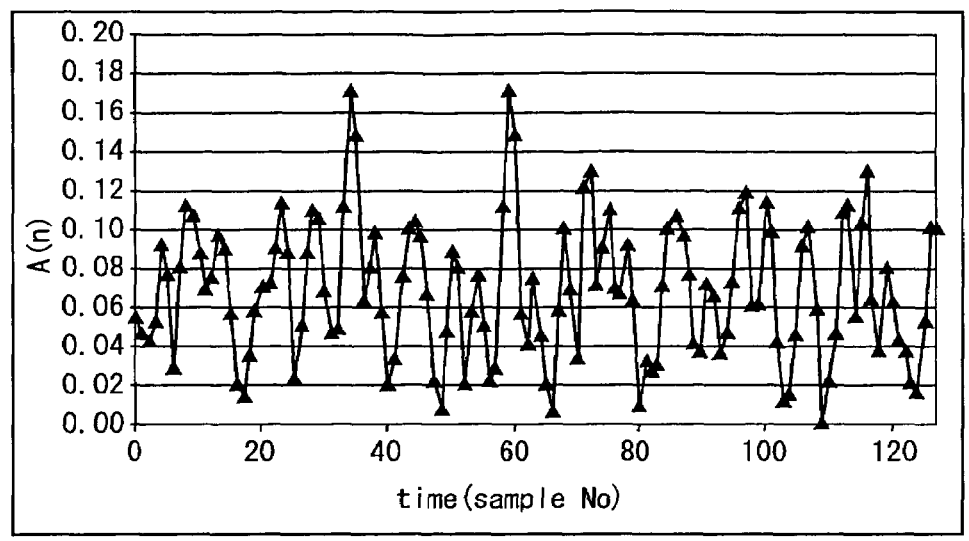
FIG. 7 shows an example of an original (undistorted) OFDM signal.

As an example, the OFDM block signal (M=64, K=2, and M*K=128) amplitude A(n) at the IFFT processor 102 is indicated in FIG. 7 as a function derived from an OFDM sample number n.

Figure 8:
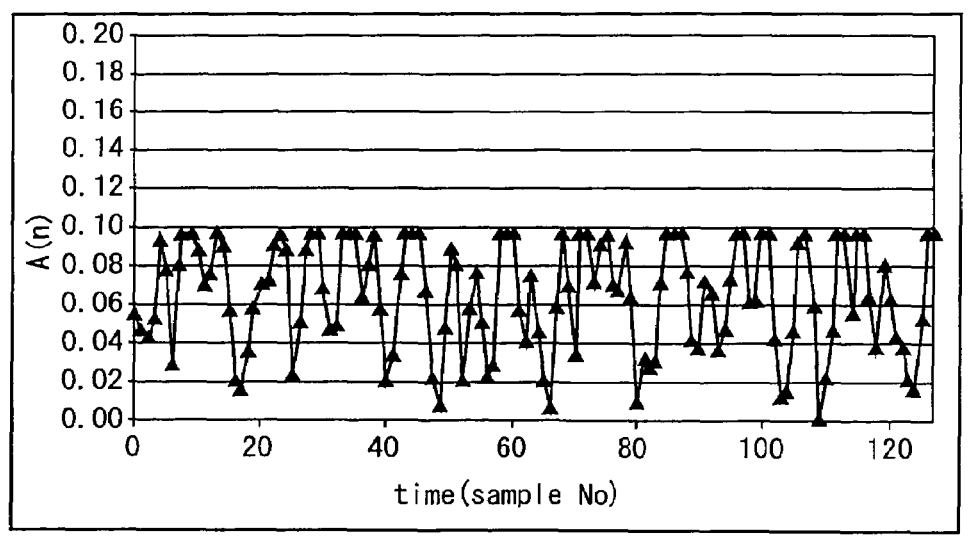
FIG. 8 shows the OFDM signal that has under gone a first clipping.

FIG. 8 shows an amplitude of an OFDM signal identical to the OFDM signal shown in FIG. 7 within an output (CR=1.8 [dB]) from the first limiter 104, as a function derived from an OFDM sample number n. As shown in FIG. 8, in this embodiment, the first limiter 104 clips (cuts), from the OFDM signal, an amplitude part at an amplitude level higher than 0.10 as the amplitude part at the level higher than the clipping level CR1.

Figure 9:
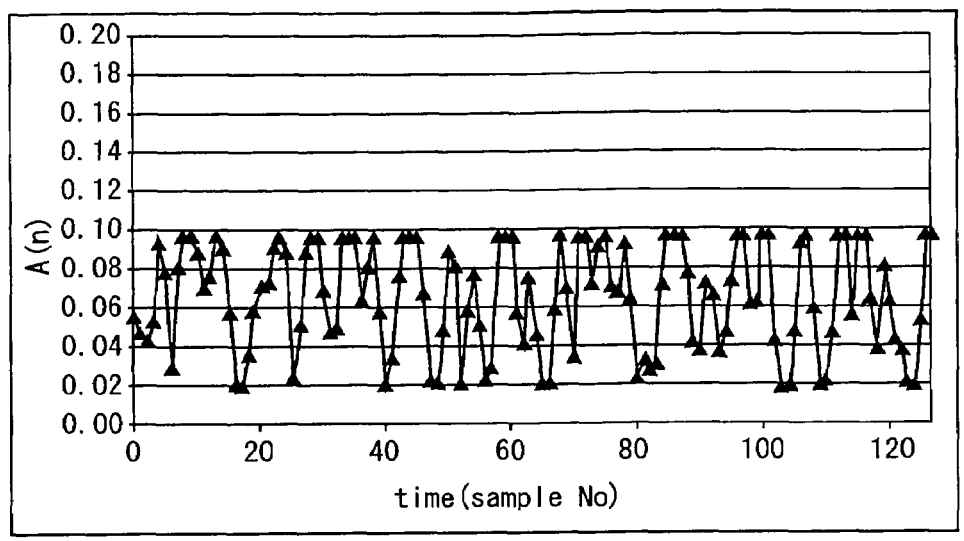
FIG. 9 shows the OFDM signal that has undergone a second clipping.

FIG. 9 shows an amplitude of an OFDM signal identical to the OFDM signal shown in FIG. 7 within an output (Expression (2), CR2=−20 [dB]) from the second limiter 105, as the function derived from the OFDM sample number n. As shown in FIG. 9, in this embodiment, the second limiter 105 clips (cuts), from the OFDM signal, an amplitude part at an amplitude level lower than 0.02 as the amplitude part at the level lower than the clipping level CR2. The clipping level CR2 is determined within a range of acceptable BER degradation by the HPAs 111 and 112 so as to produce as satisfactory power efficiency as possible.

The OFDM signal shown in FIG. 9 is composed of the amplitude modulated part (AM component: AM signal) and the DC level amplitude (DC component: DC signal; in this example, the DC level is approximately 0.02). The DC level amplitude corresponds to a phase modulated RF signal of the constant amplitude.

The LSS 106 separates an input signal (OFDM signal A(n) from the second limiter 105) that can be represented as a sum of the AM part and the DC part (Expression (3)).

$$A(n) = AM(n) + DC$$

Expression (3)

In order to extract the AM part, the LSS 106 subtracts the DC level from each A(n) signal sample according to Expression (4).

$$AM(n)=A(n)-DC \quad \text{Expression (4)}$$

Figure 10:
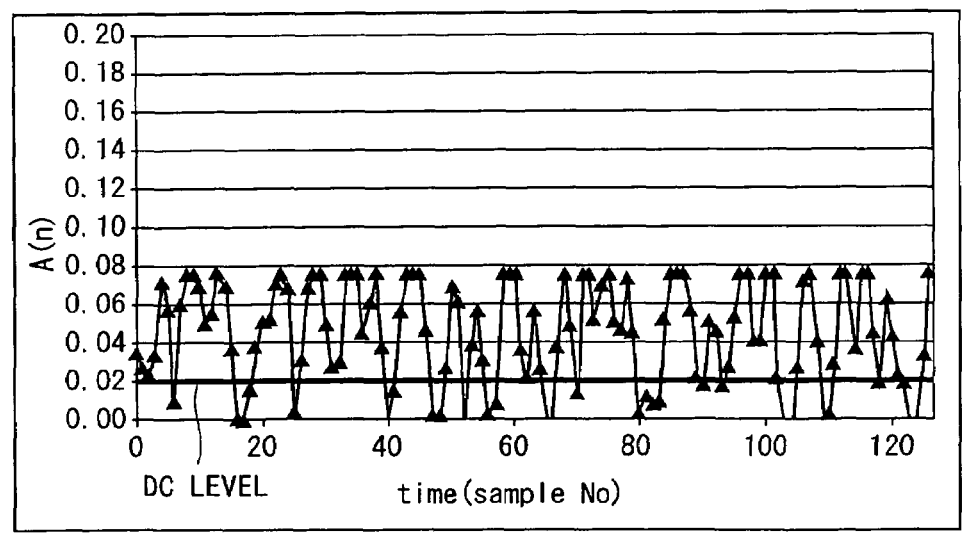
FIG. 10 shows OFDM signal separation for a constant amplitude component (bold line) and an AM component (part indicated by the arrows).

As a result of the DC subtraction (removal of DC level), as shown in FIG. 10, the amplitude level of the AM signal is shifted downward as a whole. In FIG. 10, the DC level is indicated by the bold line. According to Expression (3), LSS 106 splits the OFDM signal into two parts (AM part and DC part). The AM part (AM signal) is processed in an AM signal processing sequence (first processing sequence: LPF 107, DAC 109, and HPA 111), while the DC part (DC signal) is processed in a DC signal processing sequence (second processing sequence: LPF 108, DAC 110, and HPA 112).

Herein, the AM signal (indicated by a set of arrows in FIG. 10) represents an amplitude and a phase modulated signal having a reduced PAPR level. The amount of PAPR reduction depends on the clipping level CR2 of the second limiter 105 and acceptable BER degradation. The AM signal has the out-of-band components removed by the LPF 107, and is then subjected by the DAC 109 to D/A conversion, waveform shaping, and RF up conversion. After that, the AM signal is amplified by the HPA 111 having a linear characteristic. The HPA 111 has a linear region (dynamic range) wider than that of the HPA 112, while having an undesirable power efficiency.

The DC signal (indicated by the bold line in FIG. 10) represents a constant amplitude phase modulated signal. After out-of-band components are removed by the LPF 108, the DC signal is subjected by the DAC 110 to D/A conversion, waveform shaping, and RF up conversion. After that, the DC signal is amplified by, for example, the C-class HPA 112. Herein, class C exhibits more satisfactory power efficiency than class A or class A-B, while exhibiting a narrower dynamic range. However, since the DC signal has a constant amplitude, the DC signal does not need to have such a wide dynamic range as exhibited by class A or class A-B. Accordingly, by applying the HPA 112 to amplification of the DC signal, the power efficiency can be improved further than the case of using class A or class A-B.

The AM signal amplified by the HPA 111 and the DC signal amplified by the HPA 112 are inputted to the RF combiner 113 in order to obtain an original OFDM signal. The RF combiner 113 generates an OFDM signal by combining the AM signal and the DC signal and outputs the combined OFDM signal. Such the OFDM signal is sent out to a receiver.

According to the OFDM transmitter 100 of this embodiment, the first limiter 104 cuts out, from the OFDM signal, the amplitude part at a level higher than the amplitude level based on the clipping level CR1. Similarly, the second limiter 105 cuts out, from the OFDM signal, the amplitude part at a level lower than the amplitude level based on the clipping level CR2. Then, in the LSS 106, the DC part is removed from the OFDM signal. This allows reduction in PAPR.

Further, the OFDM signal is separated into the AM signal and the DC signal, and the AM signal is amplified by the A-class or A-B-class HPA 111, while the DC signal is amplified by the C-class HPA 112. By applying class C to amplification of the DC signal, the power efficiency can be improved with respect to the entire OFDM signal. Meanwhile, even if class C is applied to the DC signal, distortion due to the amplification does not occur, which makes is possible to suppress degradation in the OFDM signal caused by the use of class C.

As described above, according to the OFDM transmitter 100, the PAPR level of the generated OFDM signal is remarkably reduced. Accordingly, such the PAPR reduction in OFDM signal enhances the power efficiency of the HPA. In addition, there is no need to make a change in receiver, the above-mentioned system is compatible with existing communication standards.

Note that, in the above embodiment, the example to which the OFDM is applied has been illustrated as the modulation process with respect to the input data stream. However, the modulation process to which the present invention is applied is not limited to the OFDM, and the present invention may be applied to transmitters for performing various modulation processes that require power amplification.

[Others]

The disclosures of Japanese patent application No. JP2006-094232 filed on Mar. 30, 2006 including the specification, drawings and abstract are incorporated herein by reference.

What is claimed is:

1. A transmitter, comprising:
    a first limiter configured to perform a first clipping to clip signal amplitudes above an amplitude level based on a first clipping level in an input signal;
    a second limiter configured to perform a second clipping to raise signal amplitudes below an amplitude level based on a second clipping level in a first signal being the input signal that has undergone the first clipping;
    a separation section that separates a second signal being the first signal that has undergone the second clipping into an alternating current component and a direct current component;
    a first amplifier that amplifies the alternating current component;
    a second amplifier for amplifying the direct current component and;
    a combiner that outputs a third signal obtained by combining the alternating current component amplified by the first amplifier and the direct current component amplified by the second amplifier.

2. The transmitter according to claim 1, wherein the input signal is an orthogonal frequency division multiplexing signal.

3. The transmitter according to claim 1, wherein the limiter is configured to perform the second clipping to obtain the second signal from the first signal so that the second signal has a minimum amplitude level determined based on the second clipping level.

4. The transmitter according to claim 1, wherein the direct current component is removed from the second signal in the seperate section.

5. The transmitter according to claim 1, wherein the second amplifier has more satisfactory power efficiency than the first amplifier.

6. The transmitter according to claim 1, wherein the first amplifier has wider dynamic range than the second amplifier.

7. A power amplifying method, comprising:
    performing a first clipping to clip signal amplitudes above an amplitude level based on a first clipping level in an input signal;
    performing a second clipping to raise below an amplitude level based on a second clipping level in a first signal that has undergone the first clipping;
    separating a second signal being the first signal that has undergone the second clipping into an alternatimg current component and a direct current component;
    amplifying the alternating current component by a first amplifier;

amplifying the direct current component by a second amplifier; and outputting a third signal obtained by combining the alternating current component amplified by the first amplifier and the direct current component amplified by the second amplifier.

8. The power amplifying method according to claim 7, wherein the input signal is an orthogonal frequency division multiplexing signal.

9. The power amplifying method according to claim 7, wherein the second clipping is performed to obtain the second signal from the first signal so that the second signal has a minimum amplitude level determined based on the second clipping level.

10. The power amplifying method according to claim 7, wherein the direct current component is removed from the second signalin the seperating.

11. The power amplifying method according to claim 7, further comprising amplifying the direct current component by the second amplifier having more satisfactory power efficiency than the first amplifier.

12. The power amplifying method according to claim 7, further comprising amplifying the alternating current component by the first amplifier having wider dynamic range than the second amplifier.

* * * * *

UNITED STATES PATENT AND TRADEMARK OFFICE
CERTIFICATE OF CORRECTION

PATENT NO. : 7,574,189 B2
APPLICATION NO. : 11/476695
DATED : August 11, 2009
INVENTOR(S) : Alexander N. Lozhkin and Takeshi Takano It is certified that error appears in the above-identified patent and that said Letters Patent is hereby corrected as shown below:

Column 8, Claim 3, Line 42, change "according to claim 1, wherein the limiter..." to
--according to claim 1, wherein the second limited--

Signed and Sealed this

Ninth Day of March, 2010

David J. Kappos
*Director of the United States Patent and Trademark Office*

UNITED STATES PATENT AND TRADEMARK OFFICE
CERTIFICATE OF CORRECTION

PATENT NO.        : 7,574,189 B2
APPLICATION NO.   : 11/476695
DATED             : August 11, 2009
INVENTOR(S)       : Alexander N. Lozhkin and Takeshi Takano It is certified that error appears in the above-identified patent and that said Letters Patent is hereby corrected as shown below:

Column 8, Claim 3, Line 42, change "according to claim 1, wherein the limiter..." to
--according to claim 1, wherein the second limiter--

This certificate supersedes the Certificate of Correction issued March 9, 2010.

Signed and Sealed this
Nineteenth Day of February, 2013

Teresa Stanek Rea
*Acting Director of the United States Patent and Trademark Office*